United States Patent
Barker (10) Patent No.: US 9,633,150 B2
(45) Date of Patent: Apr. 25, 2017

(54) EXPERIMENTS APPROACH TO DESIGN VARIATION MITIGATION AND OPTIMIZATION

(71) Applicant: Oracle International Corporation, Redwood Shores, CA (US)

(72) Inventor: Aaron J. Barker, Broomfiled, CO (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/681,554

(22) Filed: Apr. 8, 2015

(65) Prior Publication Data

US 2016/0300004 A1    Oct. 13, 2016

(51) Int. Cl.
*G06F 17/00* (2006.01)
*G06F 17/50* (2006.01)

(52) U.S. Cl.
CPC ...... *G06F 17/5036* (2013.01); *G06F 17/5045* (2013.01); *G06F 17/5063* (2013.01)

(58) Field of Classification Search
USPC ......................................................... 716/132
See application file for complete search history.

(56) References Cited

U.S. PATENT DOCUMENTS

| | | | | |
|---|---|---|---|---|
| 2003/0229412 A1* | 12/2003 | White | ................. | G06F 17/5068 700/121 |
| 2005/0132306 A1* | 6/2005 | Smith | ................. | G06F 17/5068 716/114 |
| 2005/0273308 A1* | 12/2005 | Houston | ............... | G06F 17/504 703/14 |
| 2007/0157139 A1* | 7/2007 | White | ...................... | G03F 1/36 700/97 |
| 2010/0250187 A1* | 9/2010 | Zuber | ................. | G06F 17/5036 702/179 |
| 2012/0259446 A1* | 10/2012 | McConaghy | ....... | G06F 17/5022 700/104 |

* cited by examiner

*Primary Examiner* — Mohammed Alam
(74) *Attorney, Agent, or Firm* — Osha Liang LLP (57) ABSTRACT

A non-transitory computer readable medium including instructions which, when executed by a processor, cause the processor to: store a design metric and a design metric variation from the simulation of the design metric for a subset of a plurality of conditions in an inner loop and an outer loop, wherein in the outer loop is a sample set of design dimensions and their respective values, while the inner loop varies a plurality of variation conditions of the subset; model the design metric and design metric variation using a response surface; and optimize the design metric or the design metric variation for the subset of a plurality of design dimensions using the response surface to generate an optimized design. In other aspects, a system and a method for design variation and optimization are provided.

19 Claims, 7 Drawing Sheets

FIG. 7

EXPERIMENTS APPROACH TO DESIGN VARIATION MITIGATION AND OPTIMIZATION

BACKGROUND

The optimization of complex design problems and the mitigation of design's susceptibility to variation continue to present challenges to engineering professionals. Such design challenges are known, for example, from fuel efficiency improvement efforts in motor vehicles, electronic circuit design downscaling in microelectronics, as well as speed improvements and power reductions for consumer electronic devices, among many others. With respect to electronic circuits in general, and with respect to integrated circuits specifically, designers are often concerned with their selection of design components, design component dimensions, impact from global variations, and impact from local variations. Therefore, the subject matter of this invention relates to "Design components", "Design component dimensions", "Design component dimension values", "Global Variation", and "Local Variation." Specifically, the subject matter of this invention relates to how to identify and size these key design components and dimensions and how to mitigate global and local variation.

Design components are the components which make up a product. For microelectronics, the design components are circuit elements, e.g., resistors, capacitors, inductors, diodes, transistors, or other solid state devices. These design components are referred to in the description below as "devices." The design dimensions of an integrated circuit are the dimensions and/or materials an engineer selects and has governing authority over. The global variation of an integrated circuit results from the tolerances of the manufacturing process or operating environment, which may impact the integrated circuit as a whole. In contrast, the local variation of an integrated circuit results from random fluctuations, which occur in integrated circuit fabrication. Such local variation cannot necessarily be addressed directly by adjusting manufacturing tolerance controls.

A traditional approach to design optimization relies on the experience of a designer in knowing in which process-voltage-temperature (PVT) corner an integrated circuit exhibits the worst case behavior. In this regard, some designers rely on general knowledge, for example, that integrated circuits often behave worst in a PVT corner, where the process is slowest, the voltage is lowest, and the temperature is highest. However, not only is this assumption not necessarily always true, but also one should simultaneously consider how design metrics are affected by variability in each process corner. Further, in the traditional design approach it is assumed that the designer has knowledge of which devices, device parameters, and parameter ranges are the main contributors to design metric variation in the integrated circuit. In addition, a designer using the traditional design approach only modifies one dimension at a time; however, every part of an integrated circuit may have unique sensitivity to PVT variation.

SUMMARY

In general, in one aspect, one or more embodiments disclosed herein relate to a system for design variation mitigation and optimization, including: a simulation device, including instructions which, when executed by a processor, cause the processor to: simulate a design metric for a plurality of local variations and a plurality of global variation conditions; evaluate a global condition at which the design metric opposes a design objective and a local variation of the design metric meets a first predetermined condition; simulate the design metric for a plurality of local conditions using the evaluated global condition; evaluate a subset of the plurality of local conditions at which a variation of the design metric meets a second predetermined condition; simulate the design metric for a plurality of parameterized design dimensions in an inner loop and an outer loop, wherein in the outer loop, one of the plurality of parameterized design dimensions is maintained at a time, while the inner loop performs a variation analysis; and output the design metric and design metric variation from the inner loop and outer loop; an optimizer device comprising a first processor, a second processor, a memory, and an optimizer module configured to: store the design metric and design metric variation from the inner loop and outer loop; model the design metric and design metric variation using a response surface; and optimize the design metric or the design metric variation for the subset of a plurality of local conditions using the response surface to generate an optimized design.

In another aspect, one or more embodiments disclosed herein relate to a non-transitory computer readable medium including instructions which, when executed by a processor, cause the processor to: store a design metric and a design metric variation from the simulation of the design metric for a subset of a plurality of conditions in an inner loop and an outer loop, wherein in the outer loop is a sample set of design dimensions and their respective values, while the inner loop varies a plurality of variation conditions of the subset; model the design metric and design metric variation using a response surface; and optimize the design metric or the design metric variation for the subset of a plurality of design dimensions using the response surface to generate an optimized design.

In yet another aspect, one or more embodiments disclosed herein relate to a method for design variation mitigation and optimization, including: specifying a design metric and a design objective; providing an initial design; simulating the design metric for a plurality of local variations and a plurality of global variation conditions; evaluating a global condition at which the design metric opposes a design objective and a local variation of the design metric meets a first predetermined condition; simulating the design metric for a plurality of local conditions using the evaluated global condition; evaluating a subset of the plurality of local conditions at which a variation of the design metric meets a second predetermined condition; simulating the design metric for a plurality of parameterized design dimensions in an inner loop and an outer loop, wherein in the outer loop, one of the plurality of parameterized design dimensions is maintained at a time, while the inner loop performs a variation analysis; storing the design metric and design metric variation from the inner loop and outer loop; modeling the design metric and design metric variation using a response surface; and optimizing the design metric or the design metric variation for the subset of a plurality of local conditions using the response surface to generate an optimized design.

Other aspects of the invention will be apparent from the following description and the appended claims.

DETAILED DESCRIPTION

Specific embodiments of the invention will now be described in detail with reference to the accompanying figures. Like elements in the various figures may be denoted by like names and/or like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create a particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention relate to design variation mitigation and design optimization. Specifically, the invention relates to an initial design for which a design metric and a design objective are specified. In one or more embodiments of the invention, the design metric of the initial design may be simulated, evaluated, stored, modeled, and optimized to arrive at an improved design metric that meets the specified design objective. In one or more embodiments of the invention, the design may be an integrated circuit design and the design metric may be a timing parameter of the integrated circuit design. In other embodiments of the invention, the design may be an automotive engine design and the design metric may be the fuel efficiency of the automotive engine design. In yet other embodiments, the design may be related to mechanical, electrical, chemical, or other design areas.

Figure 1:
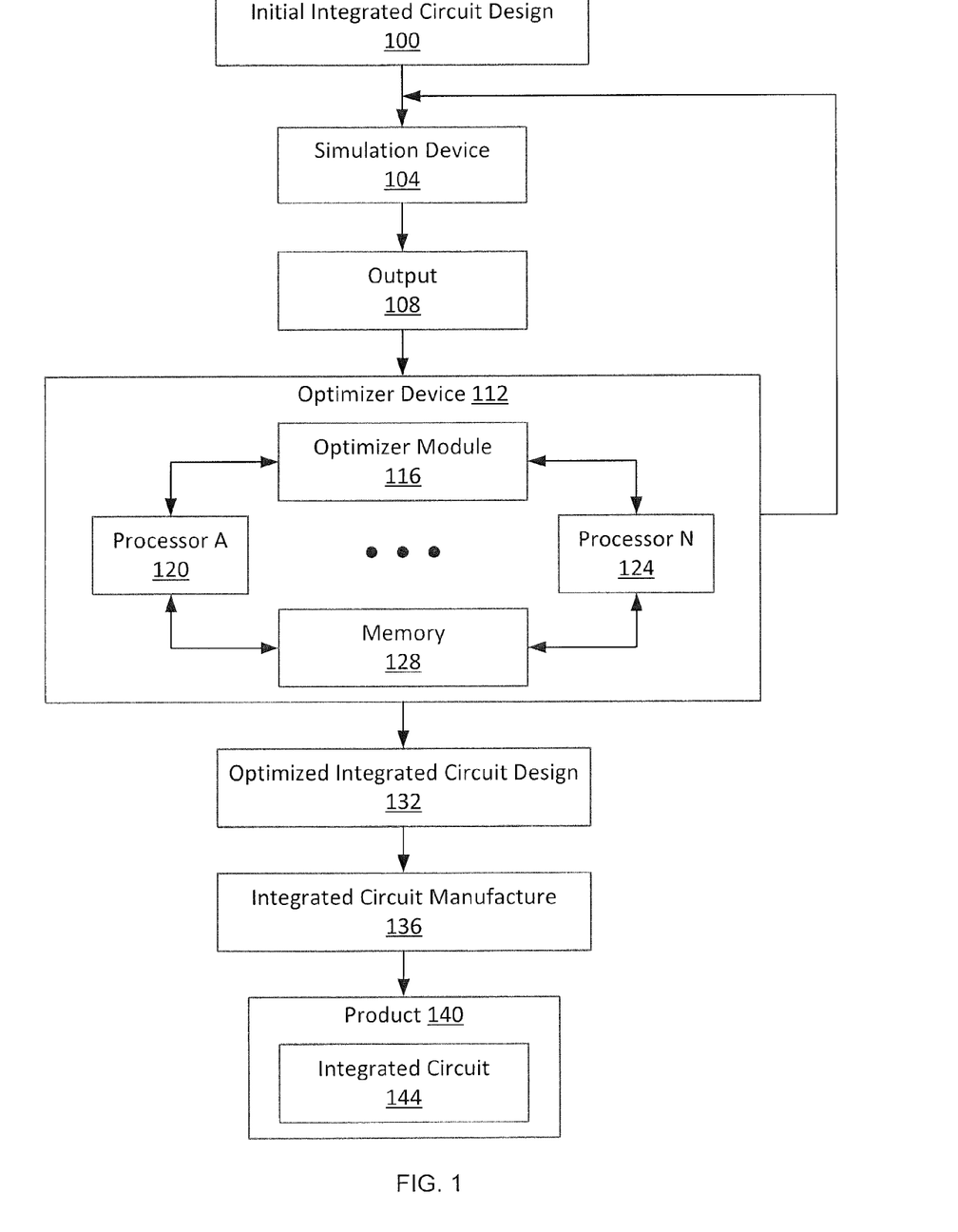
FIG. 1 shows a system in accordance with one or more embodiments of the invention.

FIG. 1 shows a block diagram of a system in accordance with one or more embodiments of the invention. Specifically, in one or more embodiments of the invention, the system includes an initial integrated circuit design (100), an simulation device (104), an output (108), an optimizer device (112), an optimized integrated circuit design (132), an integrated circuit manufacture (136), and a product (140).

The optimizer device (112) may include processors (e.g., processor A (120), processor N (124)), memory (128), and an optimizer module (116). The product (140) may include an integrated circuit (144). While FIG. 1 illustrates that optimizer device (112) may include processors, a processor may also be included in the simulation device (104) and the product (140). Each of the aforementioned components is described below.

In one or more embodiments of the invention, an initial integrated circuit design (100) is an integrated circuit design of an analog circuit, a digital circuit, or a combination thereof. In one or more embodiments of the invention, the initial integrated circuit design (100) is an integrated circuit design which may be non-optimized or only partially-optimized. For example, the initial integrated circuit design (100) may include portions from a previous optimized integrated circuit design and other new portions which have not been optimized. Alternatively, the initial integrated circuit design (100) may have been previously optimized for a particular design metric and a particular design objective, however, a new and different design metric and a new design objective have been specified. As such, the previously optimized integrated circuit design may be non-optimized with respect to the new design metric and the new design objective.

In one or more embodiments of the invention, the initial integrated circuit design (100) may be provided in hardware or in software. Specifically, the initial integrated circuit design (100) may be provided as data on a hard disk, as data on a solid state drive, as data on a flash memory, as data on a network attached storage (NAS), or as data on other suitable mediums. Alternatively, the initial integrated circuit design (100) may be provided as hardware, e.g. on an FPGA or other programmable hardware device. Further, the initial integrated circuit design (100) may be provided via physical entry, via portable mediums, via wired, or via wireless transmission. The initial integrated circuit design (100) may be provided by a netlist, which describes the connectivity of an integrated circuit design. The netlist may be provided by schematic capture of an integrated circuit design. However, the invention is not limited to these embodiments and the initial integrated circuit design (100) may be provided in different form or in a different medium.

In one or more embodiments of the invention, the simulation device (104) is operatively connected to the initial integrated circuit design (100), to the output (108), and the optimizer device (112). The simulation device (104) may be a workstation, a stand-alone computer, a portable device, or an embedded system. The simulation device (104) may be configured to do a single type of simulation or multiple types of simulation. The simulation device may support batch mode, interactive mode, or other simulation modes. Further, the simulation device may support a Simulation Program with Integrated Circuit Emphasis (SPICE) or other simulation programs.

In one or more embodiments of the invention, the output (108) is provided as software or as hardware. Specifically, the output (108) may be provided as data on a hard disk, as a solid state drive, as a flash memory, as network attached storage (NAS), or other suitable mediums. Alternatively, the output (108) may be provided as hardware, e.g., on an FPGA or other programmable hardware device. Further, the output (108) may be provided via portable mediums, via wired, or via wireless transmission. However, the invention is not limited to these embodiments and the output (108) may be provided in different form or in a different medium.

In one or more embodiments of the invention, the optimizer device (112) is operatively connected to the output (108), to the optimized integrated circuit design (132), and the simulation device (104). The optimizer device (112) may include processors (e.g., processor A (120), processor N (124)), memory (128), and an optimizer module (116). In one or more embodiments of the invention, a processor is hardware capable of executing sequence of instructions (e.g. that are stored in operatively connected memory) in order to perform operation on or otherwise manipulate data. For example, a processor may be made of silicon subjected to a fabrication process by which various circuitry components (e.g. transistors) are created in various regions of a silicon wafer. In one or more embodiments of the invention, the optimizer device (112) includes at least two processors (e.g., processor A (120), processor N (124)).

In one or more embodiments of the invention, each processor (e.g., processor A (120), processor N (124)) is operatively connected to memory (128). In one or more embodiments of the invention, memory is any hardware configured to store data and/or instructions permanently and/or temporarily. Examples of memory include, but are not limited to, random access memory (RAM), cache memory, flash memory, or any other type of memory capable of storing data and/or instructions. In one or more embodiments of the invention, memory may include multiple different memory units and/or devices. The multiple different memory units and/or devices may or may not be of the same type, located at the same physical site, and/or co-located with one or more operatively connected processors (e.g., processor A (120), processor N (124)). In one or more embodiments of the invention, the memory (128) is included as a part of the optimizer device (112). In other embodiments of the invention, the memory (12) is stand-alone memory that is operatively connected to and accessed, at least, by the optimizer device (112). In one or more embodiments of the invention, the memory includes one or more separate memory banks, each associated with at least one processor. For example, each processor in a computing device may have corresponding memory banks arranged as a part of a non-uniform memory access (NUMA) architecture.

In one or more embodiments of the invention, the optimizer device (112) includes an optimizer module (116). In one or more embodiments of the invention, the optimizer module (116) includes hardware (e.g., circuitry), software, firmware, or any combination thereof, that includes functionality to perform at least some functions described herein in accordance with one or more embodiments of the invention. For example, the optimizer module (116) may be specialized software application, or a portion thereof, executing on the optimizer device (112). In one or more embodiments of the invention, the optimizer module (116) is, at least in part, a software application, or a portion thereof, written in any programming language that includes instructions stored on a non-transitory computer readable medium which, when executed by one or more processors in a computing device, enable the computing device to perform the functions described in accordance with one or more embodiments of the invention.

In one or more embodiments of the invention, the optimized integrated circuit design (132) is operatively connected to optimizer device (112) and the integrated circuit manufacture (136). In one or more embodiments of the invention, the optimized integrated circuit design (132) is optimized with respect to a specified design metric and a design objective. The optimized integrated circuit design (132) may be provided in hardware or in software. Specifically, the optimized integrated circuit design (132) may be provided as data on a hard disk, as data on a solid state drive, as data on a flash memory, as data on a network attached storage (NAS), or as data on other suitable mediums. Alternatively, the optimized integrated circuit design (132) may be provided as hardware, e.g. on an FPGA or other programmable hardware device. Further, the optimized integrated circuit design (132) may be provided via portable mediums, via wired, or via wireless transmission. The optimized integrated circuit design (132) may be provided as an optimized netlist. However, the invention is not limited to these embodiments and the optimized integrated circuit design (132) may be provided in different form or in a different medium.

In one or more embodiments of the invention, the integrated circuit manufacture (136) includes equipment and materials to manufacture an integrated circuit with the optimized integrated circuit design (132). The integrated circuit manufacture (136) may be done in a single or in multiple manufacturing plants. In one or more embodiments of the invention, the integrated manufacture (136) may use silicon, germanium, or gallium arsenide wafers in the manufacture for the integrated circuit. Further, the integrated circuit manufacture may include equipment, such as, chemical vapor deposition (CVD) chambers, physical vapor deposition (PVD) chambers, annealing ovens, implanters, etch and clean baths, as well as lithographic tools and chemical-mechanical polishing (CMP) equipment. Further, the integrated circuit manufacture may include equipment which supports 10 nm, 14 nm, 22 nm, 32 nm, or other technology nodes. In addition the integrated circuit manufacture (136) may include a package for the integrated circuit. The package may be a package for the individual integrated circuit. Alternatively, the package may include a package for multiple integrated circuits.

In one or more embodiments of the invention, the product (140) includes integrated circuit (144). Specifically, the product (140) may be a computing device, a medical device, an entertainment device, or any other device in which an integrated circuit may be used. The product (140) may include an electronic circuit board on which the integrated circuit (144) is disposed. Alternatively, the product (140) may include the integrated circuit (144) without an electronic circuit board.

While FIG. 1 shows a configuration of components, other configurations may be used without departing from the scope of the invention. For example, various components may be combined to create a single component. As another example, the functionality performed by a single component may be performed by two or more components. In one or more embodiments of the invention, one or more of the module and elements shown in FIG. 1 may be omitted, repeated, and/or substituted. For example although FIG. 1 shows an optimizer device (112) with two processors, one of ordinary skill in the art and having the benefit of this disclosure will recognize that any number of processors or processor cores may be included in the optimizer device (112), provided that at least two streams of instructions may be executed concurrently. As an example, the optimizer device (112) may include a single processor that includes more than one processing core and/or incorporates hyper-threading. As another example, the optimizer device (112) may be a server that includes ninety-six processors.

Figure 2A:
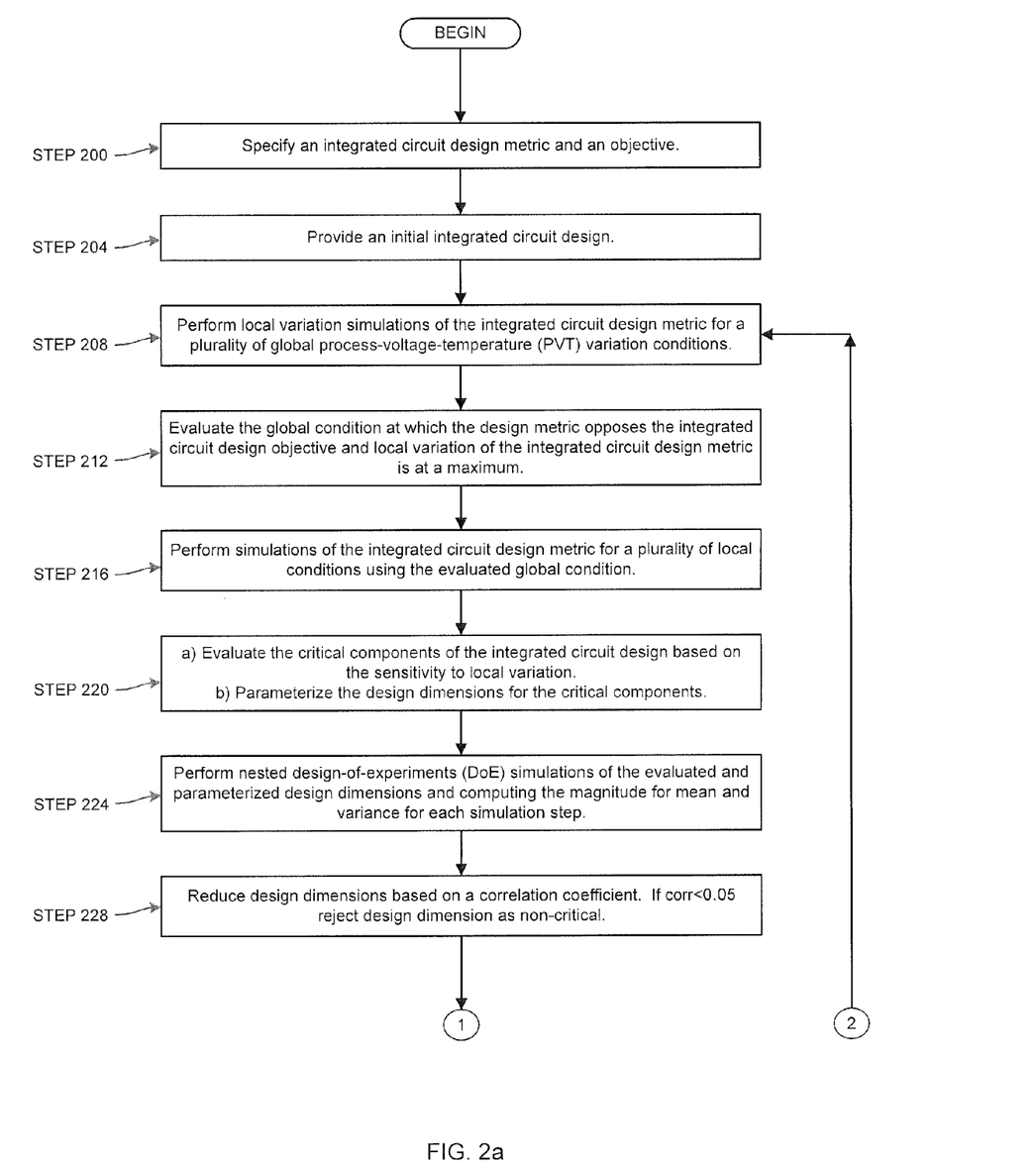
FIGS. 2a and 2b show a method flowchart in accordance with one or more embodiments of the invention.
Figure 2B:
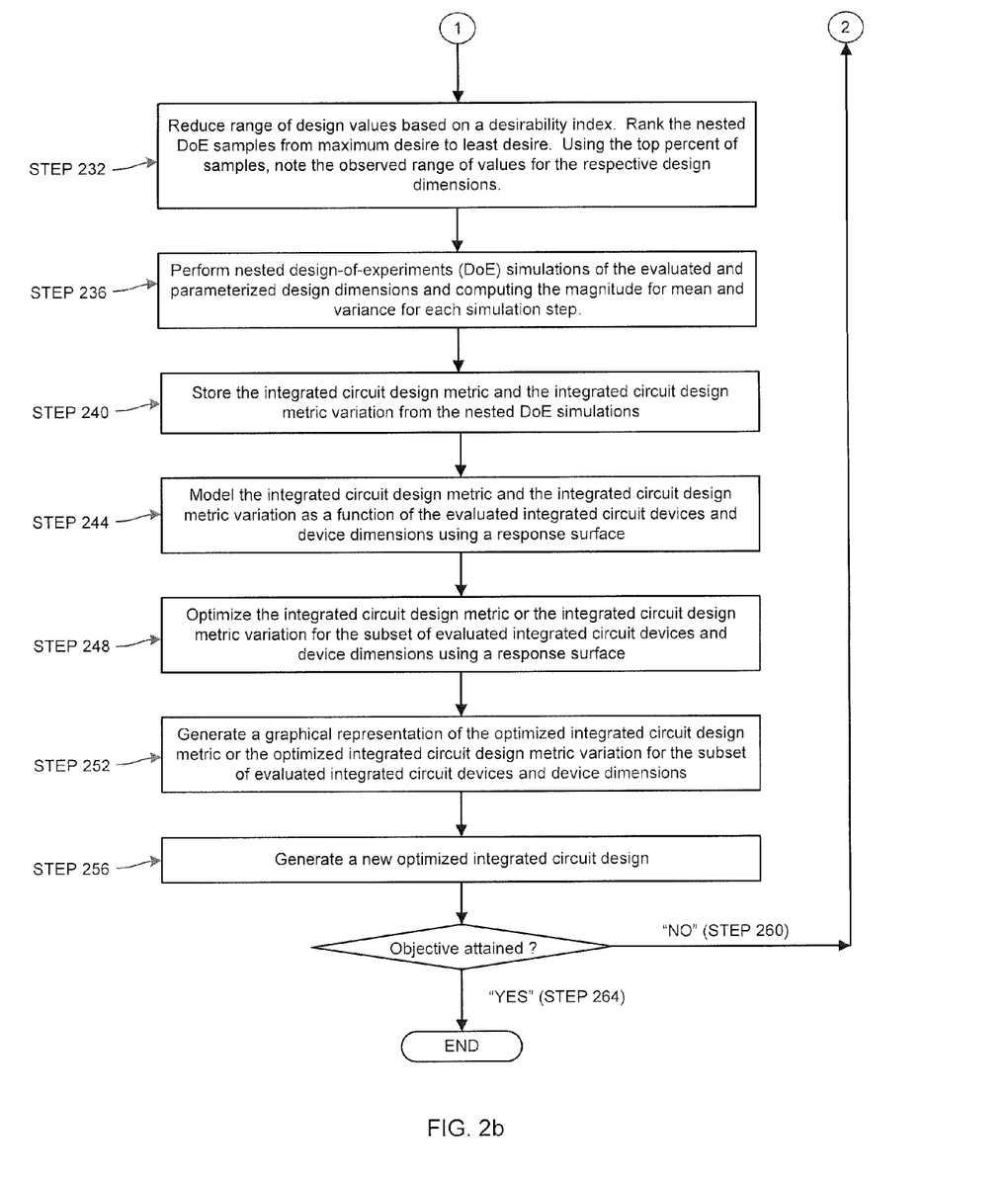

FIGS. 2a and 2b show a flowchart in accordance with one or more embodiments of the invention. While the various steps in this flowchart are presented and described sequentially, one of ordinary skill in the art will appreciate that some or all of the steps may be executed in different orders, may be combined or omitted, and some or all of the steps may be executed in parallel. Furthermore, the steps may be performed actively or passively. For example some steps may be performed using actively or passively. For example some steps may be performed using polling or be interrupt driven in accordance with one or more embodiments of the invention. By way of an example, determination or evaluation steps may be performed by performing a test, such as checking a data value to test whether the value is consistent with the tested condition in accordance with one or more embodiments of the invention.

FIGS. 2a and 2b show a flowchart describing a method for integrated circuit design variation mitigation and optimization in accordance with one or more embodiments of the invention. In Step 200, an integrated circuit design metric and an integrated circuit design objective are specified. In one or more embodiments of the invention, the integrated circuit design metric may be a timing delay. In other embodiments of the invention, the integrated circuit design metric may be a power parameter, an area parameter, a noise parameter, a readability parameter, or a speed parameter. Alternate embodiments may include a different parameter as the integrated circuit design metric. In yet further embodiments of the invention, the integrated circuit design metric may be a combination of a variety of parameters.

The integrated circuit design objective in Step 200 may include an objective, such as e.g., "minimize", "maximize", "target", "constrain", or "don't care." In other embodiments, the integrated circuit design objective in Step 200 may be a combination of a multiple objectives. Alternatively, a relative priority or a weighting of an objective may be set in Step 200, such as "minimizing timing delay is twice as important as minimizing power" or "minimizing power is twice as important as minimizing timing delay."

In Step 204, an initial integrated circuit design is provided to the method for integrated circuit design variation mitigation and optimization in accordance with one or more embodiments of the invention. In Step 208, local variation simulations of the integrated circuit design metric are done for a plurality of global process-voltage-temperature (PVT) variation conditions. In Step 212, the global condition is evaluated, at which the design metric opposes the integrated circuit design objective and local variation of the integrated circuit design metric is at a maximum.

Specifically, in a case where the integrated circuit design metric is a timing delay and the integrated circuit designer's intention is to minimize the timing delay, the integrated circuit design objective is set to "maximize," and the global condition is evaluated at which the timing delay and the variation of the timing delay are highest. In other words, the integrated circuit design objective is set to the opposite of the integrated circuit designer's intention to reveal the global condition at which the timing delay and the timing delay variation are highest. This is, because in integrated circuit testing for yield, it is often the slowest path with the highest timing delay and variation, which limit the speed of the integrated circuit. Consequently, evaluating the global condition for the opposite integrated circuit design objective which the integrated circuit designer intended, allows to find the local conditions (e.g. device parameters), which have the largest influence on the timing delay and timing delay variation as will be shown in the next steps of the method.

In Step 216, simulations of the integrated circuit design metric for a variety of local conditions are done, using the evaluated global condition at which the variation of the integrated circuit design metric is at a maximum. In one or more embodiments of the invention, the variation of the integrated circuit design metric is an intra-die variation. In one or more embodiments of the claimed invention, the variety of local conditions may be a multitude of integrated circuit devices and device parameters. As an example, such device parameter may be a transistor width, a transistor length, an implantation level, or a number of transistor "fingers." However, the invention is not limited to these embodiments and different local conditions may be specified. In one or more embodiments of the invention, a desirability function or desirability index may be introduced into the simulations to assist in the reduction of the range of the integrated circuit devices parameters.

In Step 220a, the critical components of the integrated circuit design are evaluated, based on the sensitivity to local variation. In Step 220b, the design dimensions for the critical components are parameterized. Specifically, in a case where the integrated circuit design metric is a timing delay and the design objective is set to "maximize", the integrated circuit devices and design dimensions are evaluated, for which the timing delay and variation of the timing delay are highest. In other words, integrated circuit devices (e.g., transistors) and integrated circuit device design dimensions (e.g., transistor width, transistor length, transistor implantation level (e.g., dose and energy), and number of transistor fingers) are identified, which have the largest adverse influence on the timing delay and timing variation. These evaluated local conditions are also referred to as a "subset" of the local conditions.

Having this information enables an integrated circuit designer to choose appropriate conditions in Step 224 of the method. However, the invention is not limited to the embodiments described above and other local conditions may be evaluated which have previously been simulated in Step 216 of the method. For example, an integrated circuit design may include multiple types of transistors, e.g. n-channel MOSFET (NMOS), p-channel MOSFET (PMOS). In addition, each NMOS or PMOS transistor type may further exist in a variety of instances. For example an NMOS transistor may be instantiated with thick or thin gate oxide. The same applies to PMOS transistors. Further, an integrated circuit may also contain capacitors, resistors, diodes, etc., each having respective local variation conditions. In one or more embodiments of the invention, ranges of the design dimensions are evaluated as well. As an example, the range of a transistor width may be evaluated to identify, which effective range has the largest adverse influence on the timing delay and the timing variation. However, the invention is not limited to these embodiments and the effective range of other design components and their respective design dimensions may be identified, which may become part of the subset of design components.

In Step 224, the integrated circuit design metric is set to the integrated circuit designer's intention. For example, in a case where the integrated circuit design metric is a timing delay and the integrated circuit designer's intention is to minimize the timing delay, the integrated circuit design objective is set to "minimize." Then nested design-of-experiments (DoE) simulations are done in Step 224 for the evaluated and parameterized design dimensions of Steps 220a and 220b. Further, the magnitude for mean and variance for each simulation step are computed in Step 224. With respect to the nested DoE simulations, "nested" refers to that the simulations are done with an inner and an outer loop. Both, inner and outer loops are methods of flow control in computer programs. Specifically, a loop is a program sequence which may be repeatedly carried out until a predetermined condition is met. Regarding Step 224, in the outer loop, a set of design dimensions which samples a range of design values is explored, while the inner loop samples variation conditions. These variation conditions may include Global, Local, and Total variation. In this context, DoE refers to that for each local condition in the outer loop, a variation analysis of the integrated circuit design metric (e.g., timing delay) is done.

Specifically, with respect to Steps 224, 228, 232, and 236 of the method, the purpose is to perform an "Intelligent Design Space Exploration" (IDSE), which may reduce the number of design dimensions so that the number of samples required for solving and fitting the coefficients in a response surface model, can be reduced. In addition, another purpose of IDSE is to reduce the range of exploration, because to generate a response surface model which describes the entire range of manufacturing capability for each design dimension would require a very complex model. By reducing the range of exploration to just a region of optimal desirability, it is possible to use less complex response surface models.

In one or more embodiments of the invention, the nested DoE is performed twice as shown in FIGS. 2a and 2b, once in Step 224 and another time in Step 236. However, in other embodiments of the invention, the nested DoE may be performed less or more than twice. Specifically, with respect to FIGS. 2a and 2b, the nested DOE in Step 224 is run a first time and non-essential dimensions are eliminated and the ranges of design parameters are reduced in Step 228. More specifically, in Step 228, the design dimensions are reduced based on a correlation coefficient. If a correlation is less than a numeric value of 0.05, the corresponding design dimension may be rejected as non-critical. It is noted that to eliminate design dimensions, it only requires enough samples to solve a correlation matrix. In Step 232 of the method, the range of design values is reduced based on a desirability function or desirability index. In that regard, the nested DoE samples are ranked from maximum desire to least desire. Subsequently, using the top percent of samples, the observed range of values for the respective design dimensions is noted. Further, with respect to FIGS. 2a and 2b, the nested DOE in Step 236 is run a second time to solve and fit a response surface model (RSM). In that regard, the nested DoE requires two or more samples for each coefficient in the RSM equation.

The results from the nested DoE simulations are stored in Step 240 of the method. Specifically, the integrated circuit design metric and the integrated circuit design metric variation from the nested DoE simulations are stored in Step 240 of the method. In one or more embodiments of the invention, the integrated circuit design metric and the variation of the integrated circuit design metric are computed and stored as mean and standard deviation. In other embodiments of the invention, the integrated circuit design metric and the variation of the integrated circuit design metric are computed and stored as alternate values, e.g., as percentiles of a distribution, etc. In yet other embodiments of the invention, the nested simulations of the inner and outer loop are Monte Carlo simulations.

In Step 244, the integrated circuit design metric and the variation of the integrated circuit design metric are modeled using a response surface. In one or more embodiments of the invention, the integrated circuit design metric and the variation of the integrated circuit design metric may be modeled as a function of the evaluated integrated circuit devices and device dimensions using a response surface. In one or more embodiments of the invention, the integrated circuit design metric and the variation of the integrated circuit design metric are modeled using a response surface with multivariate adaptive regression splines. Other embodiments of the claimed invention may model the integrated circuit design metric and the variation of the integrated circuit design metric using a response surface with non-linear regressors (e.g., $\log(x)$, $\mathrm{sqrt}(x)$, $\exp(x)$, $1/(x)$, $\sin(x)$, etc.). However, the invention is not limited to these embodiments and different regressions may be used to model the integrated circuit design metric and the variation of the integrated circuit design metric using a response surface. Further, in one or more embodiments of the invention, other parameters than the integrated circuit design metric and the variation of the integrated circuit design metric may be modeled using a response surface.

In Step 248, the integrated circuit design metric or the variation of the integrated circuit design metric are optimized. In one or more embodiments of the invention, the integrated circuit design metric or the variation of the integrated circuit design metric are optimized using a response surface for the subset of evaluated local conditions, such as the evaluated integrated circuit devices and device dimensions. In one or more embodiments of the invention, the optimizing of the design metric or the variation of the integrated circuit design metric using a response surface is done using a stratified Monte Carlo sampling. In other embodiments of the claimed invention, other optimizing techniques may be used. The selection of whether the integrated circuit design metric is optimized or the variation of the integrated circuit design metric is optimized may depend on the integrated circuit designer's intention. In other embodiments of the invention, the combination of the integrated circuit design metric and the variation of the integrated circuit design metric may be optimized.

In Step 252, a graphical representation of the optimized integrated circuit design metric or the optimized variation of the integrated circuit design metric for the subset of evaluated integrated circuit devices and device dimensions is generated. In one or more embodiments of the invention, the graphical representation may be represented as a function of the local conditions (e.g., the subset of evaluated integrated circuit devices and device dimensions. In one or more embodiments of the invention, the graphical representation of the optimized integrated circuit design metric or the optimized variation of the integrated circuit design metric is an interactive graphical representation. In other embodiments of the invention, the graphical representation may be for a combination of the optimized integrated circuit design metric and the variation of the integrated circuit design metric.

In yet further embodiments of the invention, when the integrated circuit designer adjusts one or more of the integrated circuit devices and device dimensions in the interactive graphical representation, the graphical representation is replotted to show the corresponding behavior of the integrated circuit design metric or the variation of the integrated circuit design metric. Once the integrated circuit designer is satisfied with the integrated circuit design, the optimized integrated circuit design is generated in Step 256 of the method. In Step 264, when the specified design objective is attained, the method ends. However, in Step 260, when the optimized design metric or the optimized variation of the design metric does not attain the specified design objective, the method for design variation mitigation and optimization is iteratively repeated for the optimized design and the method continues with Step 208. In one or more embodiments of the invention, the simulations of the integrated circuit design metric are done using a Simulation Program with Integrated Circuit Emphasis (SPICE). In other embodiments, the simulations of the integrated circuit design metric are done using a different simulation program. In further embodiments, the simulations of the integrated circuit design metric are done using a combination of SPICE and a different simulation program.

FIGS. 3*a*, 3*b*, 3*c*, 3*d*, 4, and 5 show an example in accordance with one or more embodiments of the invention. The following example is for explanatory purposes only and is not intended to limit the scope of the invention. The example may utilize terms, e.g., voltage variation, temperature variation, process variation, and design dimension. In this context, a global voltage variation may result from tolerances and fluctuations in power supply, PCB, package, voltage regulator, active power consumption, etc. In contrast, local voltage variation is due to tolerances and fluctuations in power grid, proximity to power rail, vias, circuit components switching on and off, etc. Further, global temperature variation may result from fluctuations in ambient temperature, system enclosure, heat sink mean temperature, etc. In contrast, local temperature variation is due to self-heating relative to excitation of circuit and surrounding circuitry.

With respect to process variation, as described in U.S. Pat. No. 8,271,256 (Barker et al.), global process variation may result from fluctuations in oxide thickness, dopant concentrations, length, width, flatband voltage, drain source resistance, etc. In contrast, local process variation may be due to fluctuations in channel length offset, flatband voltage, etc. In addition, in the following example, design dimensions may refer to the Berkeley short-channel IGFET model (BSIM) 4, in which W refers to width, L refers to length, NF refers to number of fingers, SD refers to poly-silicon spacing, SA and SB refer to proximity to trench isolation edge, AD refers to drain area, AS refers to source area, PD refers to drain perimeter, PS refers to source perimeter, and delta_vt refers to threshold voltage selection.

Figure 3A:
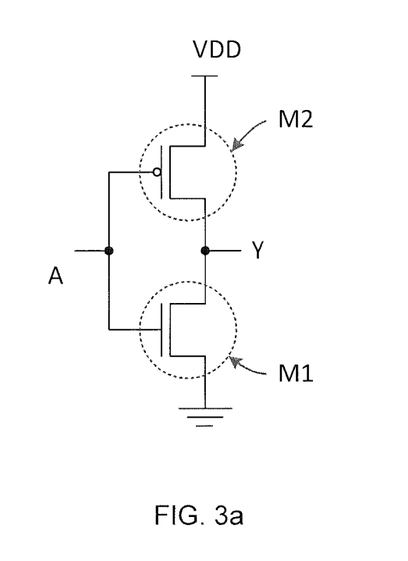
FIGS. 3a, 3b, 3c, and 3d show schematic diagrams of an inverter and a NAND gate of an initial design in accordance with one or more embodiments of the invention.
Figure 3B:
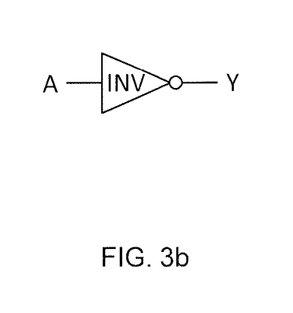

Referring to FIG. 3*a* and FIG. 3*b*, an inverter is shown with input A and output Y. FIG. 3*a* illustrates the transistors of which the inverter is composed of, while FIG. 3*b* also illustrates the same inverter, but with less detail. In FIG. 3*a*, M1 is an n-type metal oxide semiconductor field effect transistor (NMOS) while M2 is a p-type metal oxide semiconductor field effect transistor (PMOS). Power supply voltage VDD and a ground connection are provided to the inverter.

Figure 3C:
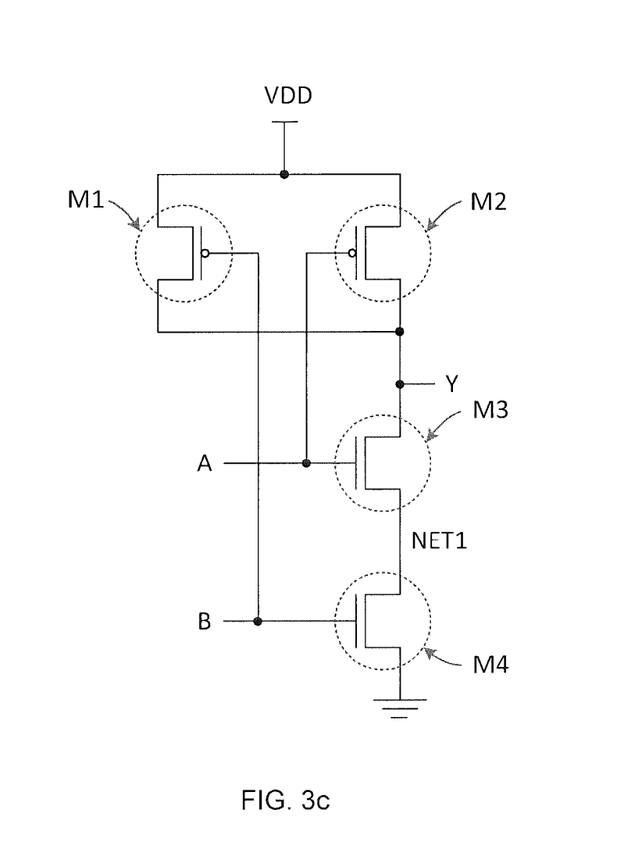
Figure 3D:
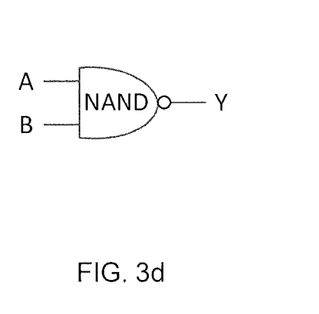

Referring to FIG. 3*c* and FIG. 3*d*, a negated AND gate (NAND gate) is shown with inputs A, B, and output Y. FIG. 3*c* illustrates the transistors of which the inverter is composed of, while FIG. 3*d* also illustrates the same NAND gate, but with less detail. In FIG. 3*c*, M1 and M2 are PMOS transistors, while M3 and M4 are NMOS transistors. Power supply voltage VDD and a ground connection are provided to the NAND gate. The label NET1 in FIG. 3*c* identifies the connection between NMOS transistor M3 and the NMOS transistor M4.

Figure 4:
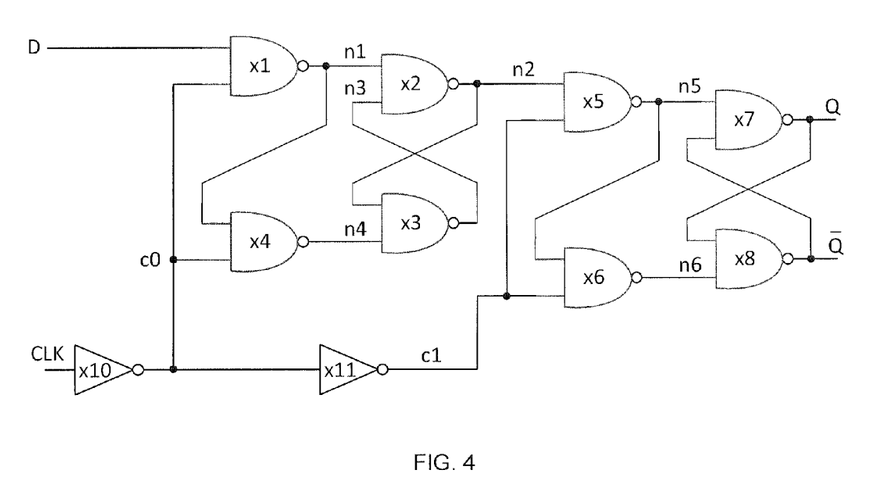
FIG. 4 shows a schematic diagram of a Master-Slave Flip-Flop (MSFF) of an initial design in accordance with one or more embodiments of the invention.

Referring to FIG. 4, a master-slave flip-flop (MSFF) is shown. The MSFF contains inverters and NAND gates previously described with reference to FIGS. 3*a*-3*d*. In FIG. 4, the NAND gates are labeled x1 through x8 while the inverters are labeled x10 through x11. Inputs to the MSFF are signal D and a clock (CLK) signal. Outputs of the MSFF are Q and Qbar where Qbar is the negated logical value of Q. Intermediate circuit connections in the MSFF are labeled with c0 through c1 to denote clock related connections. Further, other non-clock related intermediate connections in the MSFF are labeled n1 through n6. The MSFF in FIG. 4 is an initial integrated circuit design to be optimized in this example. However, the MSFF in FIG. 4 merely represents an example integrated circuit and does not limit the embodiments of the invention in any way. Accordingly, embodiments of the invention may be applied to other integrated circuits. Further, embodiments of the invention may be applied to designs that are non-electronic, e.g., within mechanical, chemical, or other design areas.

Figure 5:
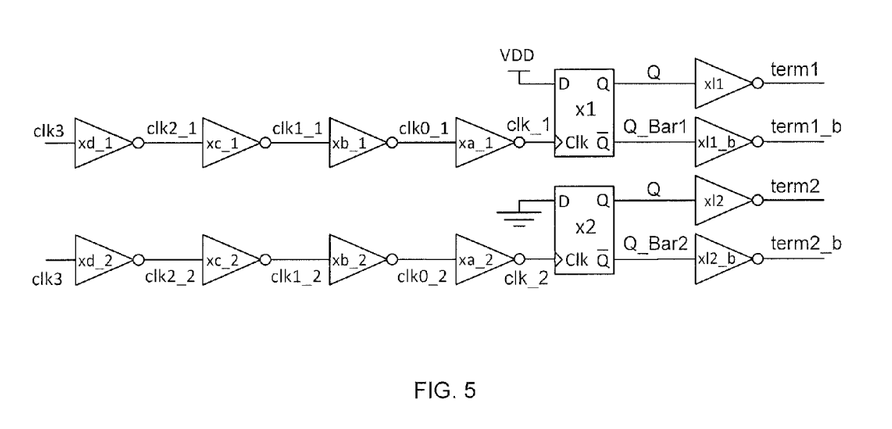
FIG. 5 shows a schematic diagram of a simulation test bench for an MSFF of an initial design in accordance with one or more embodiments of the invention.

In order that the MSFF in FIG. 4 can be simulated, the MSFF should be embedded in a test bench. The purpose of the test bench is to provide the context and stimuli for the MSFF. FIG. 5 shows a schematic diagram of such a simulation test bench for a MSFF of an initial design in accordance with one or more embodiments of the invention. In FIG. 5, x1 and x2 represent a MSFF each. The input of MSFF x1 is provided by a series of inverters xa_1 through xd_1, while the input of MSFF x2 is provided by a series of inverters xa_2 through xd_2. The outputs of MSFF x1 are provided to inverters x11 and x11_b, while the outputs of MSFF x2 are provided to inverters x12 and x12_b. The reason for two MSFF's in the test bench is that one MSFF (x1) is to measure a 0 to 1 logical transition, while the other MSFF (x2) is to measure a 1 to 0 logical transition. Here, the MSFF is used as the initial integrated circuit design. Further, in this example, the integrated circuit design metric is a timing delay and the integrated circuit designer's intention is to minimize the timing delay. Therefore, as described above, with respect to the simulations of the timing delay for a variety of global PVT corners, the integrated circuit design objective is set to the opposite, i.e., "maximize."

Table 1 below illustrates a simplified SPICE netlist for the MSFF used as the initial integrated circuit design in this example. In Table 1, the models for the simulations are specified in the ".model" statements. The ".subckt inv" paragraph describes the interconnections of the M1 and M2 transistors. Similarly, the ".subckt nand21" paragraph describes the interconnections between transistors M1, M2, M3, and M4. Subsequently, the ".subckt msff" paragraph reuses the prior interconnect definitions of "nand21" and "inv." The ".subckt flop" paragraph defines the interconnections for the embedded MSFF into a test bench. As described above, the purpose of the test bench is to provide the context and stimuli for the MSFF. Further, in Table 1, "L" refers to transistor channel length and "W" refers to transistor channel width. "

TABLE 1

* Netlist for Master-Slave Flip-Flop (MSFF) Simulation
.global VDD VSS
.model nch nmos
.model pch pmos
* Schematic name: inv
.subckt inv A Y LN=1u LP=1u WN=4u WP=8u
M1 Y A VSS VSS NCH L=LN W=WN
M2 Y A VDD VDD PCH L=LP W=WP
.ends inv TABLE 1-continued

```
* Schematic name: nand21
.subckt nand21 A B Y LN=1u LP=1u WN=4u WP=8u
M1 Y A VDD VDD PCH L=LP W=WP
M2 Y B VDD VDD PCH L=LP W=WP
M3 Y A NET1 VSS NCH L=LN W=WN
M4 NET1 B VSS VSS NCH L=LN W=WN
.ends nand21
* Schematic name: msff
.subckt msff clk d q q_bar
x1 d c0 n1 nand21 LN=0.25u LP=0.25u WN=1u WP=1u
x2 n1 n3 n2 nand21 LN=0.25u LP=0.25u WN=1u WP=1u
x3 n4 n2 n3 nand21 LN=0.25u LP=0.25u WN=1u WP=1u
x4 n1 c0 n4 nand21 LN=0.25u LP=0.25u WN=1u WP=1u
x5 n2 c1 n5 nand21 LN=0.25u LP=0.25u WN=1u WP=1u
x6 c1 n5 n6 nand21 LN=0.25u LP=0.25u WN=1u WP=1u
x7 n5 q_bar q nand21 LN=0.25u LP=0.25u WN=1u WP=1u
x8 n6 q q_bar nand21 LN=0.25u LP=0.25u WN=1u WP=1u
x10 clk c0 inv LN=0.25u LP=0.25u WN=0.5u WP=1u
x11 c0 c1 inv LN=0.25u LP=0.25u WN=0.5u WP=1u
.ends msff
* Schematic name: Test Bench
xd_1 clk3 clk2_1 inv LN=0.25u LP=0.25u WN=0.5u WP=1u
xc_1 clk2_1 clk1_1 inv LN=0.25u LP=0.25u WN=0.5u WP=1u
```

PhiF refers to Fermi level reference voltage, es refers to permittivity of silicon, eox refers to permittivity of silicon dioxide, k is the Boltzmann constant, T is the temperature in Kelvin, q refers to electron charge, Na refers to concentration of acceptors doping the substrate, Ni refers to intrinsic carrier concentration, Tox refers to oxide thickness, 1/sqrt(W*L) refers to the Pelgrom coefficient, which describes the proportionality of design dimensions to Vt variation, Cox refers to gate oxide capacitance, and Vfb is the flatband voltage, specifically the metal gate work function from which the semiconductor work function is subtracted. These textbook equations are inserted into the non-parameterized SPICE Level 3 NMOS model (University of California, Berkeley) to arrive at a parameterized SPICE Level 3 NMOS model. Further, without definitions for fast or slow corners, or knowing the process scrap limits from which standard deviation coefficients may be derived, a variation of +/−10% of nominal at +/−3 sigma global and +/−5% of nominal at +/−3 sigma local is assumed for the purpose of this example.

TABLE 2

```
* Vt=Vfb+2*PhiF+2*sqrt(es*q*Na*PhiF)*Tox/eox
* PhiF=K*T/q*ln(Na/Ni)
* Vt=Vfb+2*K*T/q*ln(Na/Ni)+2*sqrt(es*q*Na*K*T/q*ln(Na/Ni))*Tox/eox
* es=er_s*e0=11.9*8.85418781761E−12
* eox=er_ox*e0=3.9*8.85418781761E−12
* k=1.380658E−23
* T=27C=300.15K
* q=1.60217733E−19
* Na=1E17
* Ni=1.5E10
* Tox=5.7E−9
* StdDev_vt_loc -> 1/sqrt(W*L)
* Cox=eox/Tox
* Vfb
```

TABLE 1-continued

```
xb_1 clk1_1 clk0_1 inv LN=0.25u LP=0.25u WN=0.5u WP=1u
xa_1 clk0_1 Clk_1 inv LN=0.25u LP=0.25u WN=0.5u WP=1u
xd_2 clk3 clk2_2 inv LN=0.25u LP=0.25u WN=0.5u WP=1u
xc_2 clk2_2 clk1_2 inv LN=0.25u LP=0.25u WN=0.5u WP=1u
xb_2 clk1_2 clk0_2 inv LN=0.25u LP=0.25u WN=0.5u WP=1u
xa_2 clk0_2 Clk_2 inv LN=0.25u LP=0.25u WN=0.5u WP=1u
x1 Clk_1 VDD Q1 Q_BAR1 msff
x2 Clk_2 VSS Q2 Q_BAR2 msff
xl1 q1 term1 inv LN=0.25u LP=0.25u WN=0.5u WP=1u
xl2 q2 term2 inv LN=0.25u LP=0.25u WN=0.5u WP=1u
xl1_b Q_BAR1 term1_b inv LN=0.25u LP=0.25u WN=0.5u WP=1u
xl2_b Q_BAR2 term2_b inv LN=0.25u LP=0.25u WN=0.5u WP=1u
* End of netlist
```

Table 2 below shows text book equations and constants as can be found in non-patent literature "Solid State Electronic Devices", Streetman, Banerjee; 5th Edition, 2000, Prentice Hall. Specifically, in Table 2, Vt refers to threshold voltage, Table 3 below illustrates the use of a parameterized SPICE Level 3 NMOS model. This NMOS model is for exemplary purposes only and is a very simplified representation of an actual model for integrated circuit modeling. A similar PMOS model applies for modeling of the PMOS transistors. In Table 3, TOX refers to the oxide thickness underneath the gate of the NMOS transistor. NSUB refers to the substrate doping density and GAMMA is a voltage threshold parameter. Further, VTO refers to a zero-bias threshold voltage, DELTA is a width effect on the threshold voltage, and KAPPA is a saturation field factor. CSDO, CGSO, and CGBO refer to capacitances of source-drain, gate-source, and gate-bulk overlap. These parameters are SPICE model parameters of MOSFET's (e.g., NMOS, PMOS transistors). One alternative to using a parameterized model for each dimension (transistor width, transistor length, number of fingers of transistor, etc.) is to parameterize a multiplication factor in SPICE.

TABLE 3

```
*SPICE Level 3 NMOS Parameterized Model
.MODEL NCH NMOS
+   TOX='5.7E−9+0.1/3*5.7E−9*TOX_glo_sigma'
+   NSUB='1E17+0.1/3*1E17*nNSUB_glo_sigma'
+   GAMMA=0.4317311 PHI='0.7*dfm_flag'
+   VTO='(0.4238252−(2*(1.380658E−23*300.15/1.60217733E−19)*log(1E17/1.5E10)+
    2*sqrt(11.9*8.85418781761E−12*1.60217733E−19*(1E17)*(1.380658E−23*300.15/
    1.60217733E−19) *log(1E17/1.5E10)*(5.7E−9)/(3.9*8.85418781761E−12))))
    +0.1/3*0.4238252*nVTO_glo_sigma+2*(1.380658E−23*300.15/1.60217733E−19)
    *log((1E17+0.1/3*1E17*nNSUB_glo_sigma)/1.5E10)+2*sqrt(11.9*8.85418781761E−12
```

TABLE 3-continued

```
  *1.60217733E-19*(1E17+0.1/3*1E17*nNSUB_glo_sigma)*(1.380658E-23*300.15/
   1.60217733E-19)*log((1E17+0.1/3*1E17*nNSUB_glo_sigma)/1.5E10))*(5.7E-9+0.1/
   3*5.7E-9*TOX_glo_sigma)/(3.9*8.85418781761E-12)+0.05/3*0.4238252*(1/sqrt(w*l*4e12))
   *VTO_loc_sigma'
+  DELTA=0 UO=425.6466519 ETA=0 THETA=0.1754054 KP=2.501048E-4 VMAX=8.287851E4
   KAPPA=0.1686779 RSH=4.062439E-3 NFS=1E12 TPG=1 XJ=3E-7
+  LD='3.162278E-11+0.1/3*3.162278E-11*LD_glo_sigma+0.05/3*3.162278E-11*LD_loc_sigma'
+  WD='1.232881E-8+0.1/3*1.232881E-8*WD_glo_sigma+0.05/3*1.232881E-8*WD_loc_sigma'
+  CGDO='6.2E-10*5.7E-9/(5.7E-9+0.1/3*5.7E-9*TOX_glo_sigma)'
+  CGSO='6.2E-10*5.7E-9/(5.7E-9+0.1/3*5.7E-9*TOX_glo_sigma)'
+  CGBO='1E-10*5.7E-9/(5.7E-9+0.1/3*5.7E-9*TOX_glo_sigma)'
+  CJ=1.81211E-3 PB=0.5 MJ=0.3282553
+  CJSW=5.341337E-10 MJSW=0.5 )
```

Next, simulations are done for a variety of global process-voltage-temperature (PVT) corners, the results of which are shown in Table 4. These simulations are performed to identify a global process corner, which maximizes timing delay and timing delay variation. "ld_glo_sigma" refers to the global variation of lateral diffusion length, specifically the number of standard deviations the global variation of lateral diffusion length is away from the mean of a process target. "wd_glo_sigma" refers to global variation of lateral diffusion width. Similarly, "nnsub_glo_sigma" refers to a global NMOS transistor substrate doping density variation, while "pnsub_glo_sigma" refers to a global PMOS transistor substrate doping density variation. "tox_glo_sigma" is the global oxide thickness variation and "pvto_glo_sigma" and "nvto_glo_sigma" refer to the global zero-bias threshold voltage variation of a PMOS and a NMOS transistor, respectively. The values for the individual parameters represent an evaluated global process corner for which the timing delay and timing delay variation is maximized, i.e., where local devices and device dimensions have the largest adverse influence on the timing delay and variation. This global process corner (i.e., the conditions) is used in subsequent simulations.

TABLE 4

```
*** clk_q1_6p000_sh=6.22680865282168e-10 clk_q2_6p000_sh=6.90007082546083e-10
.lib delay
.param ld_glo_sigma=0.213441779363054
.param nnsub_glo_sigma=0.296506819589306
.param nvto_glo_sigma=0.153419617916565
.param pnsub_glo_sigma=0.239784997972321
.param pvto_glo_sigma=0.544058795831057
.param tox_glo_sigma=-2.72170781380957
.param wd_glo_sigma=0.514380066092472
.endl delay
```

Once the global process corner has been evaluated for which the timing delay and timing delay local variation is maximized, then simulations of the timing delay are done for a variety of local variation conditions. Based on the sensitivity to the local variation, the design components which have a significant correlation (>0.05) to the timing delay and timing delay variation, are identified. Table 5 illustrates the design components (e.g., transistors/circuit components) for which the integrated circuit design objective is "maximize" and the timing delay is at a maximum. Specifically, the individual line items indicate which circuit components adversely affect the timing delay and timing delay variation. For example, "M.x1.x10.M1" refers to MSFF x1 in the test bench, and x10 is an inverter in which M1 is an NMOS transistor. Similarly, "M.x2.x4.M2" refers to MSFF x2 in the test bench, and x4 is a NAND gate in which M2 is a PMOS transistor. See also FIGS. 3a, 3b, 3c, 3d, 4, and 5. A line item in Table 5, which is preceded by a "*" indicates that this particular device does not significantly influence the timing delay or timing delay variation, therefore it can be discarded for subsequent simulations.

TABLE 5

| | |
|---|---|
| M.x1.x10.M1 | M.x2.x10.M1 |
| M.x1.x11.M2 | M.x2.x11.M2 |
| M.x1.x7.M1 | M.x2.x8.M1 |
| M.x1.x5.M4 | M.x2.x7.M4 |
| M.x1.x11.M1 | M.x2.x6.M3 |
| M.x1.x5.M2 | M.x2.x11.M1 |
| M.x1.x7.M3 | M.x2.x6.M1 |
| *M.x1.x8.M4 | M.x2.x3.M1 |
| *M.xl1.M1 | M.xa_2.M2 |
| *M.x1.x6.M3 | M.x2.x7.M2 |
| *M.x2.x10.M1 | *M.x2.x4.M2 |

Once the local devices are known which adversely affect the timing delay and timing delay variation, a desirability function or desirability index used during the prior simulations may be utilized to further reduce the simulation range of exploration for the design dimensions, for example, the width of the transistor. In this example, the ranges of the width of the NMOS transistors wn and the width of the PMOS transistors wp may be reduced. Table 6 illustrates the reduced ranges, in which "wn_x10_m1," for example, refers to the transistor width of the NMOS transistor M1 in the inverter x10. See also FIGS. 3a, 3b, 3c, 3d, 4, and 5. The values for each line item are the start and stop values for the transistor width range in micrometers.

TABLE 6

| | | |
|---|---|---|
| wn_x10_m1 | 2.249e-6 | 3.995e-6 |
| wn_x11_m1 | 2.574e-7 | 3.349e-6 |
| wn_x5_m4 | 1.141e-6 | 3.863e-6 |
| wn_x6_m3 | 8.251e-7 | 3.923e-6 |
| wn_x7_m3 | 8.586e-7 | 3.703e-6 |
| wn_x7_m4 | 8.748e-7 | 3.996e-6 |

TABLE 6-continued

| | | |
|---|---|---|
| wp_x11_m2 | 1.815e-6 | 3.995e-6 |
| wp_x5_m2 | 3.309e-7 | 2.787e-6 |
| wp_x6_m1 | 2.515e-7 | 3.924e-6 |
| wp_x7_m1 | 7.341e-7 | 3.960e-6 |
| wp_x7_m2 | 2.682e-7 | 3.168e-6 |
| wp_x8_m1 | 1.166e-6 | 3.968e-6 |

Next, nested design-of-experiments (DoE) simulations are done for the evaluated subset of design components or circuit elements for their reduced range of design dimensions. Specifically, the evaluated subset of design components is represented by the reduced transistors depicted in Table 5 and the reduced range of transistor widths is shown in Table 6. It is important to realize that this example is a very simplified example for the purpose of illustration only, because a large integrated circuit design would contain many more devices and device dimensions. As described above, for the purpose of this example, the integrated circuit designer's intention is to minimize the timing delay of the MSFF, therefore the integrated circuit design objective is set to "minimize" for the nested DoE simulations. In the outer loop of the nested simulations, a transistor width of the subset of transistor widths is maintained, while the inner loop varies transistor widths of the subset. Regarding the DoE, for each transistor width in the outer loop, a variation analysis of the timing delay is done, the results of which are stored. After that, the timing delay and the timing delay variation are modeled as a function of the reduced transistors and transistor widths using a response surface. In this example, the modeling of the timing delay and timing delay variation is done using multivariate adaptive regression splines with added non-linear candidate regressors.

Figure 7:
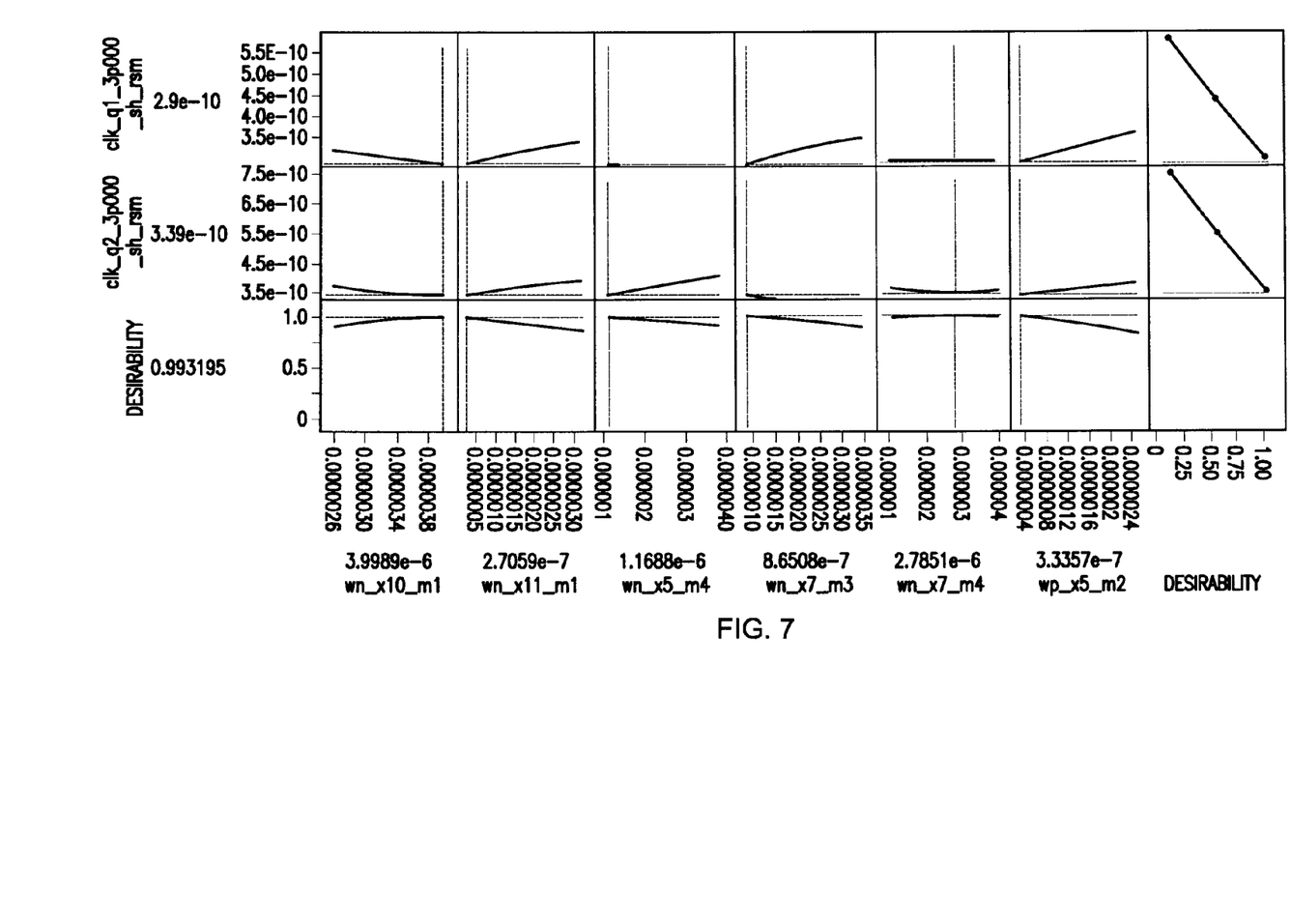
FIG. 7 shows a graphical representation of timing delays in accordance with one or more embodiments of the invention.

Following the modeling of the timing delay and timing delay variation, the timing delay or the timing delay variation is optimized for the reduced transistors and transistor widths using a response surface. For the purpose of this example, stratified Monte Carlo sampling is used to optimize the timing delay or the timing delay variation. Next, a graphical representation of the optimized timing delay or the optimized timing delay variation for the reduced transistors and transistor widths is generated. FIG. 7 depicts the graphical representation of the combined optimized timing delay and the timing delay variation. Specifically, "3p000_sh" on the vertical axis refers to "three point zero sigma high." In other words, the timing delay in FIG. 7 is shown as the combination of the timing delay shown as mean of the timing delay, while three sigma of the timing delay variation is added to the timing delay mean. In this example, three sigma has been chosen as a generalized default, based on the process capability for the particular manufacturing technology. However, in a case where additional information regarding the number of instances on the die is available, the sigma value may be adjusted based on yield requirements. For example, the sigma value may be adjusted accordingly by computing the quantile of a normal distribution with a mean of zero and a standard deviation of one, for the percentile of percentage_yield^(1/# instances). In the statistical language "R", this expression becomes ">qnorm(0.99^(1/#instances),0,1))."

In this way, the minimization of the three sigma high point will minimize both the mean and standard deviation. The horizontal axis in FIG. 7 shows the width of the reduced subset of NMOS and PMOS transistors. It is noted that when compared to Table 6, only a selected number of NMOS and PMOS transistors are shown in FIG. 7. This is to allow for the remaining transistors to be more easily viewed. Similar graphs are generated for the remaining transistors in Table 6. Further, the dotted lines in FIG. 7 indicate the current widths and corresponding timing delay values which the integrated circuit designer has currently selected.

Next, if the integrated circuit designer is satisfied with the integrated circuit design, the optimized integrated circuit design is generated. However, in case that the optimized timing delay and timing delay variation does not attain the specified design objective (e.g., minimize), the method for design variation mitigation and optimization is iteratively repeated for the optimized design and the method continues with Step 208 in FIG. 2*a*.

Figure 6:
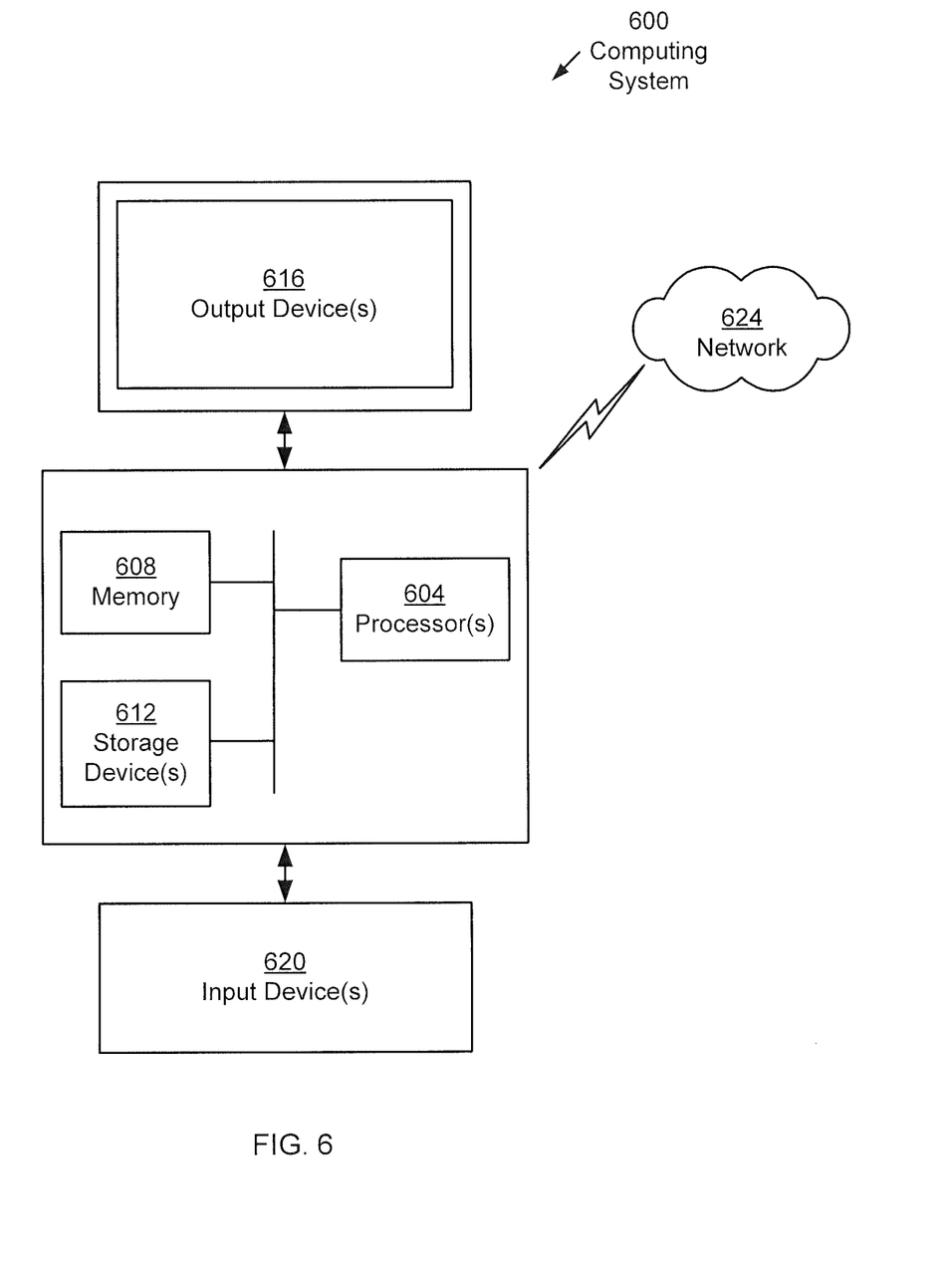
FIG. 6 shows a computing system in accordance with one or more embodiments of the invention.

Embodiments of the invention may be implemented on virtually any type of computing system, regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, as shown in FIG. 6, the computing system (600) may include one or more processor(s) (604), associated memory (608) (e.g., random access memory (RAM), cache memory, flash memory, etc.), one or more storage device(s) (612) (e.g., a hard disk, an optical drive such as a compact disk (CD) drive or digital versatile disk (DVD) drive, a flash memory stick, etc.), and numerous other elements and functionalities. The processor(s) (604) may be an integrated circuit for processing instructions. For example, the processor(s) may be one or more cores, or micro-cores of a processor. The computing system (600) may also include one or more input device(s) (620), such as a touchscreen, keyboard, mouse, microphone, touchpad, electronic pen, or any other type of input device. Further, the computing system (600) may include one or more output device(s) (616), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (600) may be connected to a network (624) (e.g., a local area network (LAN), a wide area network (WAN) such as the Internet, mobile network, or any other type of network) via a network interface connection (not shown). The input and output device(s) may be locally or remotely (e.g., via the network (624)) connected to the processor(s) (604), memory (608), and storage device(s) (612). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (600) may be located at a remote location and connected to the other elements over a network (624). Further, embodiments of the invention may be implemented on a distributed system having numerous nodes, where each portion of the invention may be located on a different node within the distributed system. In one embodiment of the invention, the node corresponds to a distinct computing device. Alternatively, the node may correspond to a processor with associated physical memory. The node may alternatively correspond to a processor or micro-core of a processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for design variation mitigation and optimization, comprising:
    a simulation device, comprising instructions which, when executed by a processor, cause the processor to:
        simulate a design metric for a plurality of local variations and a plurality of global variation conditions related to one selected from a group consisting of an electrical design, a chemical design, and a mechanical design;
        evaluate a global condition at which the design metric opposes a design objective and a local variation of the design metric meets a first predetermined condition;
        simulate the design metric for a plurality of local conditions using the evaluated global condition;
        evaluate a subset of the plurality of local conditions at which a variation of the design metric meets a second predetermined condition;
        simulate the design metric for a plurality of parameterized design dimensions in an inner loop and an outer loop of one selected from a group consisting of nested design-of-experiments (DoE) simulations and nested Monte Carlo simulations, wherein in the outer loop, one of the plurality of parameterized design dimensions is maintained at a time, while the inner loop performs a variation analysis; and
        output the design metric and design metric variation from the inner loop and outer loop;
    an optimizer device comprising a first processor, a second processor, a memory, and an optimizer module configured to:
        store the design metric and design metric variation from the inner loop and outer loop;
        model the design metric and design metric variation using a response surface; and
        optimize the design metric or the design metric variation for the subset of a plurality of local conditions using the response surface to generate an optimized design.

2. The system according to claim 1, wherein the design is an integrated circuit design.

3. The system according to claim 1, wherein the design metric variation is an intra-die variation.

4. The system according to claim 1, wherein at least one of global and local simulations is performed using SPICE (Simulation Program with Integrated Circuit Emphasis).

5. The system according to claim 1, wherein a graphical representation of the optimized design metric or the optimized design metric variation as a function of the local conditions is generated.

6. The system according to claim 5, wherein the graphical representation of the optimized design metric or the optimized design metric variation is an interactive graphical representation.

7. The system according to claim 1, wherein the design metric and the design metric variation are computed at least as mean and standard deviation.

8. A non-transitory computer readable medium comprising instructions which, when executed by a processor, cause the processor to:
    simulate a design metric for a plurality of local variations and a plurality of global variation conditions related to one selected from a group consisting of an electronical design, a chemical design, and a mechanical design;
    evaluate a global condition at which the design metric opposes a design objective and a local variation of the design metric meets a first predetermined condition;
    simulate the design metric for a plurality of local conditions using the evaluated global condition;
    evaluate a subset of the plurality of local conditions at which a variation of the design metric meets a second predetermined condition;
    simulate the design metric for a plurality of parameterized design dimensions in an inner loop and an outer loop of one selected from a group consisting of nested design-of-experiments (DoE) simulations and nested Monte Carlo simulations, wherein in the outer loop, one of the plurality of parameterized design dimensions is maintained at a time, while the inner loop performs a variation analysis; and
    output the design metric and a design metric variation from the inner loop and outer loop,
    wherein the design metric and the design metric variation from the inner loop and the outer loop are stored,
    wherein the design metric and the design metric variation are modeled using a response surface, and
    wherein the design metric or the design metric variation for the subset of the plurality of local conditions is optimized using the response surface to generate an optimized design.

9. A method for design variation mitigation and optimization, comprising:
    specifying a design metric and a design objective;
    providing an initial design representing one selected from a group consisting of an electrical design, a chemical design, and a mechanical design;
    simulating the design metric for a plurality of local variations and a plurality of global variation conditions;
    evaluating a global condition at which the design metric opposes a design objective and a local variation of the design metric meets a first predetermined condition;
    simulating the design metric for a plurality of local conditions using the evaluated global condition;
    evaluating a subset of the plurality of local conditions at which a variation of the design metric meets a second predetermined condition;
    simulating the design metric for a plurality of parameterized design dimensions in an inner loop and an outer loop of one selected from a group consisting of nested design-of-experiments (DoE) simulations and nested Monte Carlo simulations, wherein in the outer loop, one of the plurality of parameterized design dimensions is maintained at a time, while the inner loop performs a variation analysis;
    storing the design metric and design metric variation from the inner loop and outer loop;

modeling the design metric and design metric variation using a response surface; and optimizing the design metric or the design metric variation for the subset of a plurality of local conditions using the response surface to generate an optimized design.

10. The method according to claim 9, wherein the design is an integrated circuit design.

11. The method according to claim 9, wherein the design metric variation is an intra-die variation.

12. The method according to claim 9, wherein at least one of global and local simulations is performed using SPICE (Simulation Program with Integrated Circuit Emphasis).

13. The method according to claim 9, wherein a graphical representation of the optimized design metric or the optimized design metric variation as a function of the local conditions is generated.

14. The method according to claim 13, wherein the graphical representation of the optimized design metric or the optimized design metric variation is an interactive graphical representation.

15. The method according to claim 9, wherein when the optimized design metric or the optimized design metric variation does not attain the design objective, the method for electronic design variation mitigation and circuit optimization is iteratively repeated for the optimized design.

16. The method according to claim 9, wherein the design metric and the design metric variation are computed at least as mean and standard deviation.

17. The method according to claim 9, wherein the design metric or design metric variation is modeled using a response surface with multivariate adaptive regression splines.

18. The method according to claim 9, wherein the design metric or design metric variation is modeled using a response surface with non-linear regressors.

19. The method according to claim 9, wherein optimizing the design metric or the design metric variation using the response surface is done using stratified Monte Carlo sampling.

* * * * *

UNITED STATES PATENT AND TRADEMARK OFFICE
CERTIFICATE OF CORRECTION

PATENT NO. : 9,633,150 B2  
APPLICATION NO. : 14/681554  
DATED : April 25, 2017  
INVENTOR(S) : Barker Page 1 of 1

It is certified that error appears in the above-identified patent and that said Letters Patent is hereby corrected as shown below:

On the Title Page

In Column 1, under Inventor, Line 1, delete "Broomfiled," and insert -- Broomfield, --, therefor.

In the Specification

In Column 10, Line 6, delete "1/(x))," and insert -- 1/(x), --, therefor.

In Column 12, Line 53, delete "width. "" and insert -- width. --, therefor.

In Column 15, Line 10, delete "CGDO" and insert -- CSDO --, therefor.

In Column 15, Line 14, delete "MJSW=0.5 )" and insert -- MJSW=0.5) --, therefor.

In Column 17, Line 61, delete "(1/#instances),0,1))."" and insert -- (1/#instances),0,1)." --, therefor.

In the Claims

In Column 20, Line 13, in Claim 8, delete "electronical" and insert -- electrical --, therefor.

Signed and Sealed this  
Twelfth Day of September, 2017

Joseph Matal  
*Performing the Functions and Duties of the*  
*Under Secretary of Commerce for Intellectual Property and*  
*Director of the United States Patent and Trademark Office*